United States Patent [19]

Nakamura et al.

[11] Patent Number: 5,389,884
[45] Date of Patent: Feb. 14, 1995

[54] PARALLEL PLATE DIELECTRIC CONSTANT MEASURING APPARATUS HAVING MEANS FOR PREVENTING SAMPLE DEFORMATION

[75] Inventors: Nobutaka Nakamura; Masafumi Take; Nobuo Iizuka, all of Tokyo, Japan

[73] Assignee: Seiko Instruments Inc., Tokyo, Japan

[21] Appl. No.: 57,766

[22] Filed: May 7, 1993

[30] Foreign Application Priority Data

May 7, 1992 [JP] Japan .................................. 4-115011

[51] Int. Cl.6 ...................... G01R 27/26; G01N 27/22
[52] U.S. Cl. .................................. 324/663; 324/688; 73/61.41
[58] Field of Search .............. 324/661, 663, 671, 674, 324/686, 688; 73/61.41, 61.43

[56] References Cited

U.S. PATENT DOCUMENTS 3,450,988  6/1969  Breen et al. ..................... 324/688 X
3,942,107  3/1976  Gerhard .
4,658,207  4/1987  Scribano et al. .
5,120,273  8/1992  Takahashi ....................... 324/688 X

FOREIGN PATENT DOCUMENTS 1271524  7/1990  Canada .
2093196  8/1982  United Kingdom .

Primary Examiner—Gerard R. Strecker
Assistant Examiner—Diep Do
Attorney, Agent, or Firm—Spensley Horn Jubas & Lubitz

[57] ABSTRACT

In order to measure a complex dielectric constant, a sample 8 enveloped by a ring 9 and two laminas 10 is inserted between parallel plate electrodes constituted by an exciting electrode 2 and a response electrode 3. Measuring data is obtained as a measuring value of the sample 8 itself because an operational circuit 21 removes parasitic effects of the ring 9 and the lamina 10. Dielectric characteristics of a fluid sample can be obtained readily and accurately without contaminating the electrodes.

5 Claims, 1 Drawing Sheet

PARALLEL PLATE DIELECTRIC CONSTANT MEASURING APPARATUS HAVING MEANS FOR PREVENTING SAMPLE DEFORMATION

BACKGROUND OF THE INVENTION

The present invention relates to an apparatus with parallel plate electrodes for analyzing dielectric characteristics of a material as a function of temperature, frequency, or time.

Various techniques have been proposed for measuring the dielectric characteristic of a material as a function of temperature, frequency, or time and for evaluating the material on the basis of an electrical, chemical, or physical characteristic. The measurement generally is performed by arranging a sample between a pair of parallel plate electrodes and measuring the capacitance produced between the electrodes. The dielectric constant is obtained by applying the capacitance value to the following expression:

$$C = \epsilon_r \epsilon_0 (S/d)$$

where
- C: Capacitance
- S: Electrode area
- d: Distance between electrodes (sample thickness)
- $\epsilon_r$: Relative dielectric constant of a sample
- $\epsilon_0$: Dielectric constant of vacuum Thus the dielectric constant of a sample can be measured by using an electrode with a known area and measuring the distance between the electrodes or the thickness of a certain sample.

However, measuring dielectric constants at varied temperatures can cause melting or softening of a sample, a change in the thickness of a sample upon cooling, and welding between an electrode and a sample, thus resulting in lowered measuring accuracy as well as experimental inconveniences. Effective countermeasures against those problems have been proposed as follows:

(1) An interdigital exciting electrode and a response electrode are arranged on a ceramic substrate so as to be close to each other. One example of such device is Micromet, Umetric, System II Option S-60 type ceramic sensor manufactured by Micromet Co. in U.S.A.);

(2) A sample sandwiched between insulating thin film members is measured using a parallel plate electrode; and (3) A parallel plate electrode formed on a ceramic substrate is disposable if it experiences welding. The distance between the electrodes is measured and controlled. Such an arrangement is disclosed in Japanese Patent Application Laid-open No. 85770-1990.

The above proposed methods have the following disadvantages:

Method (1) cannot provide a spatially uniform electric field, comparing with the method using the parallel plate electrode. Since a sample is arranged in an uneven electric field, the measuring values depend disadvantageously on the shape of the sample. Furthermore since the electrode is formed on a single ceramic substrate, the measuring result involves a dielectric constant component of the ceramic substrate material, thus causing lowered accuracy of measurement.

Method (2) can prevent the contamination of an electrode due to welding because a sample in a fluid state touches directly to the electrode. However it is difficult to maintain constant the distance between the parallel plate electrodes during measurement. Particularly since the structure used in method (2) cannot prevent a sample from spreading in the radial direction, it is difficult to maintain a sample in a fixed shape during measurement. Furthermore the dielectric constant of the insulating material inserted between a sample and an electrode may cause a measuring error in the measured dielectric constant of the sample.

In method (3), the flatness of the electrode of a ceramic substrate tends to be degraded in comparison with that of an electrode made through conventional metal processing. In addition, when the ambient temperature of the electrodes is varied over several hundreds C°, it is extremely difficult to measure the distance between the electrodes to an accuracy of several $\mu$m. Hence there is a disadvantage in that the method is impractical.

SUMMARY OF THE INVENTION

It is a primary object of the present invention to overcome the above-mentioned disadvantages and particularly to improve method (2), above.

The above and other objects are achieved, according to the present invention, by an apparatus which is mainly constituted by: parallel plate electrodes arranged in a heating oven; at least one insulating thin film member pair for preventing a circular sample from directly contacting the electrodes; an insulating ring member for restricting the circular sample to be fluidized radially, the insulating ring member being arranged so as to surround the sample and having the same thickness as that of the sample; and a measuring circuit for calculating the dielectric constant of only the sample from among: the sample inserted between the parallel plate electrodes, the insulating thin film member, and the insulating ring member.

In the above structure, first, the complex dielectric constants of the insulating thin film member and the insulating ring member are as follows:

The complex dielectric constant of the insulating thin film member is:

$$\epsilon_L^* = \epsilon_L' - i\epsilon_L''$$

and the complex dielectric constant of the insulating ring member is:

$$\epsilon_R^* = \epsilon_R' - i\epsilon_R''.$$

In each case, $\epsilon'$ and $\epsilon''$ are the real and imaginary components, respectively, of the complex dielectric constant.

The insulating thin film member and the insulating ring member each are made in a discrete and standard disk form and are subjected to a preliminary measurement in order to determine the complex dielectric constant dependence on temperature and frequency. Next, the insulating ring member is arranged on an insulating thin film. Then a sample to be measured is filled in the ring and is covered with an insulating thin film. The sample and the ring which are inserted between the insulating thin films are sandwiched between the parallel plate electrodes, as is done with a conventional sample. The entire structure is subjected to a measurement of complex dielectric constant with the frequency and/or temperature being varied. Then the relations between the capacitance values and dielectric constants of the sample, the insulating thin film, and the insulating ring which are arranged between the electrodes, and the composite capacitance value, $C_M^*$, and dielectric constant of the sandwiched sample are given by the following expressions:

Capacitance $$1/C_M^* = 1/(C^* + C_R^*) + 2/C_L^* \qquad \text{Expression (1)}$$

where
- $C^*$: Complex capacitance of a sample
- $C_R^*$: Complex capacitance of an insulating ring
- $C_L^*$: Complex capacitance of an insulating thin film
- $C_M^*$: Measured complex capacitance of the sandwiched sample.

The relation between capacitance and relative dielectric constant $$C^* = (S_R/t_R)\epsilon_0 \epsilon^* \qquad \text{Expression (2)}$$
$$C_R^* = ((S - S_R)/t_R)\epsilon_0 \epsilon_R^* \qquad \text{Expression (3)}$$
$$C_L^* = (S/t_L)\epsilon_0 \epsilon_L^* \qquad \text{Expression (4)}$$
$$C_M^* = (S/t_M)\epsilon_0 \epsilon_M^* \qquad \text{Expression (5)}$$

where
- $t_R$: Thickness of insulating ring
- $t_L$: Thickness of insulating thin film
- $t_M$ Thickness of a sandwiched sample ($= t_R + 2t_L$)
- $S$: Electrode area
- $S_R$: Inner area of an insulating ring
- $\epsilon_0$: Dielectric constant of vacuum
- $\epsilon^*$: Complex relative dielectric constant of a sample ($= \epsilon' - i\epsilon''$)
- $\epsilon'$: Complex dielectric constant real part (storage dielectric constant)
- $\epsilon''$: Complex dielectric constant imaginary part (loss dielectric constant)
- $\epsilon_R^*$: Complex relative dielectric constant of an insulating ring ($= \epsilon_R' - i\epsilon_R''$)
- $\epsilon_L^*$: Complex relative dielectric constant of an insulating thin film ($= \epsilon_L' - i\epsilon_L''$)
- $\epsilon_M^*$: Measured complex relative dielectric constant of a sandwiched sample ($= \epsilon_M - i\epsilon_M''$)

The complex relative dielectric constant $\epsilon^*$ ($= \epsilon' - i\epsilon''$) of a sample to be measured can be expressed using $\epsilon_R^*$, $\epsilon_L^*$, and $\epsilon_M^*$ at the same temperature and frequency.

By substituting expressions (2) to (5) for expression (1) to solve for $\epsilon^*$, the following expressions are given:

film and insulating ring, whereby a measurement can be performed accurately while a sample in a fluid state is maintained in it original shape.

BRIEF DESCRIPTION OF DRAWING

The sole FIGURE is a cross sectional view, combined with a block diagram, showing a preferred embodiment of an embodiment of a parallel plate dielectric constant measuring apparatus according to the present invention.

DESCRIPTION OF THE PREFERRED EMBODIMENTS

Figure 1:
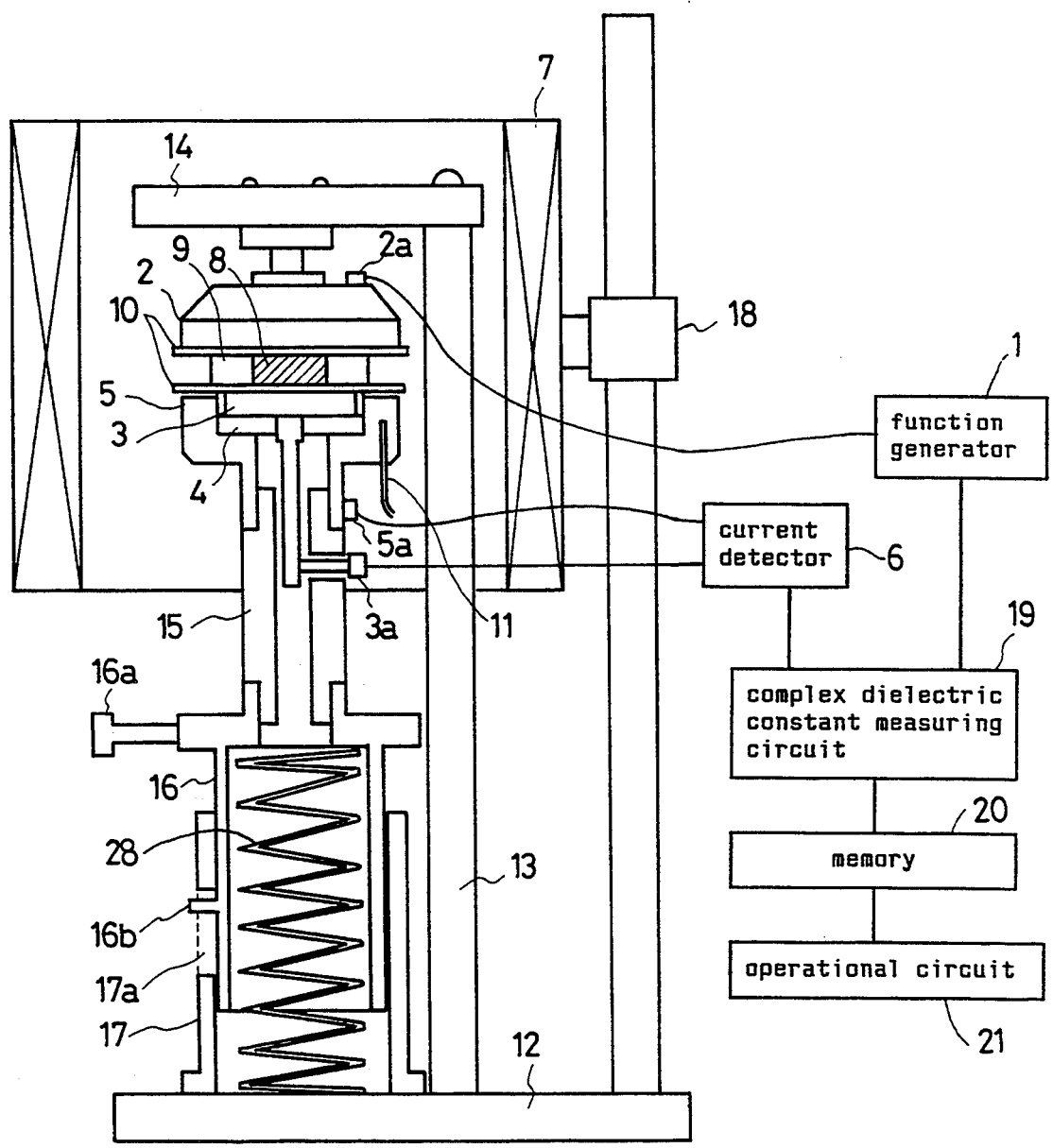

A detailed explanation will be presented below for an embodiment of a parallel plate dielectric constant measuring apparatus according to the present invention, reference being made to the FIGURE.

In the FIGURE, numeral 1 represents a function generator for generating a sine wave voltage having a predetermined amplitude and frequency. The generator 1 also provides a voltage signal to a terminal 2a of an exciting electrode 2, exciting electrode 2 having a disc portion, to produce an electric field across a sample. A response electrode 3 having a flat surface facing the flat surface of the exciting electrode 2 is arranged under the exciting electrode 2 and is mounted on a ground electrode 5 via an alumina upper ring spacer 4. The exciting electrode 2, the response electrode 3, and the ground electrode 5 are made of stainless steel, respectively, and form as a whole a so-called three-terminal type parallel plate electrode with a guard ring.

A sample generally is inserted between the exciting electrode 2, on the one hand, and the response electrode 3 and the ground electrode 5, on the other hand. A current detector 6 is connected to a terminal 3a of the response electrode 3 as well as to a terminal 5a of the ground electrode 5 to detect a current conducted by the response electrode 3.

In the FIGURE, numeral 7 represents a heating oven. The heating oven 7 is arranged so as to surround the electrodes and the sample and can vary the temperature of the sample.

A sample 8 may be inserted in a ring 9 of Teflon and is sandwiched between two laminae 10 of Teflon in order to facilitate removal of the sample from the exciting electrode 2, the response electrode 3, and the ground electrode 5 when the sample is in fluid form or $$\epsilon' = \frac{S t_R \left( \dfrac{t_m \epsilon_m'}{(\epsilon_m')^2 + (\epsilon_m'')^2} - \dfrac{2 t_L \epsilon_L'}{(\epsilon_L')^2 + (\epsilon_L'')^2} \right)}{S_R \left( \dfrac{t_m^2}{(\epsilon_M')^2 + (\epsilon_M'')^2} + \dfrac{4 t_L^2}{(\epsilon_L')^2 + (\epsilon_L'')^2} - \dfrac{8 t_M t_L (\epsilon_M' \epsilon_L' + \epsilon_M'' \epsilon_L'')^2}{\{(\epsilon_M')^2 + (\epsilon_M'')^2\}\{(\epsilon_L')^2 + (\epsilon_L'')^2\}} \right)} - \left( \frac{S}{S_R} - 1 \right) \epsilon_R' \qquad \text{Expression (6)}$$

$$\epsilon'' = \frac{S t_R \left( \dfrac{t_m \epsilon_m'}{(\epsilon_m')^2 + (\epsilon_m'')^2} - \dfrac{2 t_L \epsilon_L'}{(\epsilon_L')^2 + (\epsilon_L'')^2} \right)}{S_R \left( \dfrac{t_m^2}{(\epsilon_M')^2 + (\epsilon_M'')^2} + \dfrac{4 t_L^2}{(\epsilon_L')^2 + (\epsilon_L'')^2} - \dfrac{8 t_M t_L (\epsilon_M' \epsilon_L' + \epsilon_M'' \epsilon_L'')^2}{\{(\epsilon_M')^2 + (\epsilon_M'')^2\}\{(\epsilon_L')^2 + (\epsilon_L'')^2\}} \right)} - \left( \frac{S}{S_R} - 1 \right) \epsilon_R'' \qquad \text{Expression (7)}$$

The dielectric constant of a sample itself can be measured by outputting as the dielectric constant of a sample the complex relative dielectric constant $\epsilon_M^*$ ($= \epsilon' - i\epsilon''$) based on the expressions (6) and (7) obtained.

In this case, materials (for instance, polytetrafluoroethylene, alumina) which are not softened at the measuring temperatures may be used for the insulating thin is expected to become fluid at a measuring temperature. The sandwiched sample assembly formed of the sample 8, the ring 9, and the two laminae 10 is inserted between the exciting electrode 2, and the response electrode 3 and the ground electrode 5, to subject it to a dielectric constant measurement. The temperature of the sample is measured with a thermocouple 11 inserted in a slit portion formed at the lower portion of the ground electrode 5.

The exciting electrode 2 is screwed on an alumina supporting plate 14 which is fixed on a supporting strut 13. Strut 13, in turn, stands on a base 12. On the other hand, the ground electrode 5 is held on an alumina stage 15 supported on a stainless steel cup member 16. The cup member 16 has one end connected to a handle 16a. The handle 16a is used to displace electrodes 3 and 5 to permit a sample assembly to be placed, or removed from, between those electrodes and electrode 2. The cup member 16 is inserted in a cylindrical member 17 having an inner diameter substantially equal to the outer diameter of cup member 16. Cylindrical member 17 is fixed on base 12. A compressed spring 28 is arranged in a compressed state in the space formed between base 12, cylindrical member 17 and the cup member 16, and spring 18 pushes ground electrode 5 and response electrode 3 upwardly together with the cup member 17 and the stage 15.

During measurement, the sample is pressed against the exciting electrode 2 with a constant pressure. A pin-like protruding element 16b is mounted at the exterior surface of cup member 16 and engages in a T-shaped slot 17a formed in cylindrical member 17. For the installation or removal of a sample, an operator can latch the protruding element 16b securely in the slot 17 by pushing down and twisting the handle 16a. In this case distance created between the electrodes enables the installation and removal of a sample.

On the other hand, the heating oven 7 is raised and lowered by the moving mechanism 18 supported by the base 12.

A complex dielectric constant measuring circuit 19 for measuring by any well-known method receives signals from the function generator 1 and the current detector 6 and outputs a measured value representative of a dielectric constant. The measured value is stored in a memory 20. An operational circuit 21 connected to the memory 20 calculates the complex dielectric constant of the fluidic sample 8 according to the following expression:

$$\epsilon' = \frac{S t_R \left( \frac{t_m \epsilon_m'}{(\epsilon_m')^2 + (\epsilon_m'')^2} - \frac{2 t_L \epsilon_L'}{(\epsilon_L')^2 + (\epsilon_L'')^2} \right)}{S_R \left( \frac{t_m^2}{(\epsilon_M')^2 + (\epsilon_M'')^2} + \frac{4 t_L^2}{(\epsilon_L')^2 + (\epsilon_L'')^2} - \frac{8 t_M t_L (\epsilon_M' \epsilon_L' + \epsilon_M'' \epsilon_L'')^2}{\{(\epsilon_M')^2 + (\epsilon_M'')^2\}\{(\epsilon_L')^2 + (\epsilon_L'')^2\}} \right) - \left( \frac{S}{S_R} - 1 \right) \epsilon_R'}$$

$$\epsilon'' = \frac{S t_R \left( \frac{t_m \epsilon_m'}{(\epsilon_m')^2 + (\epsilon_m'')^2} - \frac{2 t_L \epsilon_L'}{(\epsilon_L')^2 + (\epsilon_L'')^2} \right)}{S_R \left( \frac{t_m^2}{(\epsilon_M')^2 + (\epsilon_M'')^2} + \frac{4 t_L^2}{(\epsilon_L')^2 + (\epsilon_L'')^2} - \frac{8 t_M t_L (\epsilon_M' \epsilon_L' + \epsilon_M'' \epsilon_L'')^2}{\{(\epsilon_M')^2 + (\epsilon_M'')^2\}\{(\epsilon_L')^2 + (\epsilon_L'')^2\}} \right) - \left( \frac{S}{S_R} - 1 \right) \epsilon_R''}$$

where all equation terms are as defined earlier herein.

Furthermore the loss angle tangent tan δ can be easily obtained by applying both the storage dielectric constant $\epsilon'$ and the loss dielectric constant $\epsilon''$ to the following expression:

$$\tan \delta = \epsilon''/\epsilon'$$

Namely, according to the present invention, a change in the dielectric constant at or during a softening process of a fluidic viscous fluid sample (for instance, a hardening process of an adhesive agent) can be measured without allowing it to directly contact the parallel electrodes.

In the above explanation, a stainless steel has been used as an electrode material but may be replaced with other good conductive metal materials. The surface of the conductive metal may be plated with gold. When a lamina or ring material with higher heat resistance is required, sintered alumina or other insulating material may be used.

As described above, according to the present invention, since a change in dielectric constant with respect to temperature, frequency, and/or time of a fluid sample can be measured without directly contacting the electrodes, a sample can be installed and removed very easily. During a measurement, since the deformation of a sample due to softening or hardening can be suppressed thanks to the strength of the material used for a lamina or a ring sample deformation is minimized, so that the reliability of a measured value can be increased effectively. Furthermore, according to the process of the present invention, since there is no severe restriction to the electrode material, the flatness of a stainless steel electrode can be increased to the limit. There is no contamination due to sample welding, and accordingly an expensive electrode can be used effectively without any risk.

This application relates to subject matter disclosed in Japanese Application number 4-115011, filed on May 7, 1992, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A parallel plate measuring apparatus for measuring the dielectric constant of a sample, the sample having a thickness, said apparatus comprising: an exciting electrode having a flat surface portion; a response electrode having a flat surface portion facing, and parallel to, said flat surface portion of said exciting electrode; a sample holding assembly composed of at least one pair of insulating thin film members and an insulating ring member having a thickness equal to the thickness of the sample, said ring member being interposed between said insulating thin film members and being disposed to prevent radial flow of the sample, and said assembly being disposed, when the dielectric constant of the sample is to be measured, between said flat surface portions of said exciting electrode and said response electrode so that a respective insulating thin film member is disposed between the sample and a respective one of said electrodes, and between said insulating ring member and a respective one of said electrodes, for preventing the sample and said insulating ring member from directly contacting each of said electrodes when the sample and said insulating ring member are arranged between said exciting electrode and said response electrode; a heating oven disposed to surround said exciting electrode and said response electrode for varying the temperature of the sample; circuit means connected to said exciting electrode and said response electrode for applying an alternating voltage between said electrodes and for detecting a current flowing between said electrode in response to the voltage when a sample is disposed between said electrodes; and a dielectric constant measuring circuit connected to said circuit means for receiving signals representing the alternating voltage and the current and for calculating the dielectric constant of only the sample independently of the dielectric constants of said insulating thin film members and said insulating ring member inserted between said exciting electrode and said response electrode; whereby fluid flow of the sample during heating of the sample and welding between the sample and said electrodes during cooling of the sample is prevented so that the dielectric constant of the sample is measured accurately.

2. Apparatus as defined in claim 1 wherein said insulating ring member has a rectangular cross section.

3. Apparatus as defined in claim 1 wherein said insulating ring member has opposed end surfaces which contact said insulating thin film members and are smaller than said flat surface portions of said electrodes.

4. Apparatus as defined in claim 1 wherein said insulating thin film members and said insulating ring member enclose a space which corresponds substantially to the shape of the sample.

5. Apparatus as defined in claim 1 wherein the alternating voltage is a sine wave voltage.

* * * * *